US006610465B2

(12) United States Patent
Rahman et al.

(10) Patent No.: US 6,610,465 B2
(45) Date of Patent: Aug. 26, 2003

(54) PROCESS FOR PRODUCING FILM FORMING RESINS FOR PHOTORESIST COMPOSITIONS

(75) Inventors: M. Dalil Rahman, Flemington, NJ (US); Douglas McKenzie, Easton, PA (US); Takanori Kudo, Bedminster, NJ (US); Munirathna Padmanaban, Bridgewater, NJ (US)

(73) Assignee: Clariant Finance (BVI) Limited (VG)

( * ) Notice: Subject to any disclaimer, the term of this patent is extended or adjusted under 35 U.S.C. 154(b) by 196 days.

(21) Appl. No.: 09/833,226

(22) Filed: Apr. 11, 2001

(65) Prior Publication Data

US 2002/0197555 A1 Dec. 26, 2002

(51) Int. Cl.[7] .............................. G03F 7/32; B01D 39/00
(52) U.S. Cl. .................... 430/327; 430/270.1; 430/331; 210/502.1; 528/482; 526/328; 526/329; 526/328.5
(58) Field of Search ................................ 430/270.1, 170, 430/327; 528/482; 526/328, 329, 328.5; 210/502.1; 162/164.2

(56) References Cited

U.S. PATENT DOCUMENTS

| 4,606,824 A | | 8/1986 | Chu et al. | |
|---|---|---|---|---|
| 5,543,263 A | * | 8/1996 | Rahman et al. | 430/168 |
| 6,103,122 A | | 8/2000 | Hou et al. | |
| 6,447,980 B1 | * | 9/2000 | Rahman et al. | 430/270.1 |
| 6,531,267 B2 | * | 3/2003 | Oberlander | 430/327 |

FOREIGN PATENT DOCUMENTS

| WO | WO 98/04348 A | * | 2/1998 | ............ B01J/47/00 |
|---|---|---|---|---|
| WO | WO 99 39246 A | | 8/1999 | |

* cited by examiner

*Primary Examiner*—Janet Baxter
*Assistant Examiner*—Yvette C. Thornton
(74) *Attorney, Agent, or Firm*—Krishna G. Banerjee; Alan P. Kass

(57) ABSTRACT

The present invention provides a method for producing a film forming resin suitable for use in a photoresist composition, involving the following steps: (a) providing a solution of a film forming resin in a solvent; (b) providing the following two filter sheets: (i) a filter sheet containing a self-supporting fibrous matrix having immobilized therein a particulate filter aid and particulate ion exchange resin particles, where the particulate filter aid and ion exchange resin particles are distributed substantially uniformly throughout a cross-section of said matrix; and (ii) a filter sheet containing a self-supporting matrix of fibers having immobilized therein particulate filter aid and binder resin; (c) rinsing the filter sheets of step (b) with the solvent of step (a); and (d) passing the solution of the film forming resin through the rinsed filter sheets of step (c).

53 Claims, No Drawings

PROCESS FOR PRODUCING FILM FORMING RESINS FOR PHOTORESIST COMPOSITIONS

FIELD OF THE INVENTION

The present invention provides a process for producing a film forming resin suitable for use in photoresist compositions. The process involves removing metal ion impurities from such a film forming resin by passing a film forming resin having metal ion impurities through one or more filter sheets as described hereinbelow. One of the filter sheets comprising a self-supported fibrous matrix having immobilized therein a particulate filter aid and a particulate ion exchange resin. The other filter sheet comprises a self supporting matrix of fibers, such as cellulose fibers, having immobilized therein a particulate filter aid and binder resin, and preferably not containing any ion exchange resin embedded therein.

BACKGROUND OF THE INVENTION

Photoresist compositions are used in microlithography processes for making miniaturized electronic components, such as in the fabrication of computer chips and integrated circuits. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked-coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed (in the case of positive photoresist) or the unexposed (in the case of negative photoresist) areas of the coated surface of the substrate.

Metal ion contamination has been a problem for a long time in the fabrication of high density integrated circuits, computer hard drives and computer chips, often leading to increased defects, yield losses, degradation and decreased performance. In plasma processes, metal ions such as sodium and iron, when they are present in a photoresist, can cause contamination especially during plasma stripping. However, these problems can be overcome to a substantial extent during the fabrication process, for example, by utilizing HCl gettering of the contaminants during a high temperature anneal cycle.

As electronic devices have become more sophisticated, these problems have become much more difficult to overcome. When silicon wafers are coated with a liquid positive photoresist and subsequently stripped off, such as with oxygen microwave plasma, the performance and stability of the semiconductor device is often seen to decrease because of the presence of what would be considered very low levels of metal ions. As the plasma stripping process is repeated, more degradation of the device frequently occurs. A primary cause of such problems has been found to be metal ion contamination in the photoresist, particularly sodium and iron ions. Metal ion levels of less than 100 ppb (parts per billion) in the photoresist have sometimes been found to adversely affect the properties of such electronic devices. Impurity levels in photoresist compositions have been and are currently controlled by (1) choosing materials for photoresist compositions which meet strict impurity level specifications and (2) carefully controlling the photoresist formulation and processing parameters to avoid the introduction of impurities into the photoresist composition. As photoresist applications become more advanced, tighter impurity specifications must be made.

Film forming resins (such as film forming novolak resins and vinylphenol resins) are frequently used a polymeric binder in liquid photoresist formulations. In producing sophisticated semiconductor and other microelectronic devices, it has become increasingly important to provide film forming resins having metal ion contamination levels below 50 ppb each. The present invention provides a method for producing such film forming resins having very low metal ion concentrations.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron is quite common. In addition, it is almost always desirable that the developed photoresist wall profiles be near vertical relative to the substrate. Such demarcations between developed and undeveloped areas of the resist coating translate into accurate pattern transfer of the mask image onto the substrate.

U.S. Pat. No. 6,103,122 discloses a filter sheet which comprises a self-supporting fibrous matrix having immobilized therein particulate filter aid and particulate ion exchange resin, wherein said particulate filter aid and particulate ion exchange resin are distributed substantially uniformly throughout a cross-section of said matrix. A process for removing ionic impurities from a photoresist solution which comprises passing the photoresist solution through said filter sheet to remove ionic impurities therefrom is also disclosed in this patent.

SUMMARY OF THE INVENTION

The present invention provides a method for producing a film forming resin suitable for use in a photoresist composition, said method comprising the steps of:

(a) providing a solution of a film forming resin in a solvent, said film forming resin made by polymerizing at least one monomer comprising a cycloolefin or an acid labile acrylate or a methacrylate monomer;

(b) providing at least one of the following two filter sheets:
  (i) a filter sheet comprising a self-supporting fibrous matrix having immobilized therein a particulate filter aid and a particulate ion exchange resin, said ion exchange resin having an average particle size of from about 2 to about 10 micrometers ($\mu$m), wherein said particulate filter aid and ion exchange resin particles are distributed substantially uniformly throughout a cross-section of said matrix; and/or
  (ii) a filter sheet comprising a self-supporting matrix of fibers having immobilized therein a particulate filter aid and a binder resin, said filter sheet having an average pore size of 0.05 to 0.5 $\mu$m;

(c) rinsing the filter sheet of step b) with the solvent of step a); and (d) passing the solution of the film forming resin through the rinsed filter sheet of step (c), thereby producing the film forming resin suitable for use in a photoresist composition.

The present invention also provides a method for producing a photoresist composition, said method comprising: providing an admixture of: 1) a film forming resin prepared by the foregoing method; 2) a photosensitive component in an amount sufficient to photosensitize a photoresist composition; and optionally 3) an additional suitable photoresist solvent.

The present invention also provides a method for producing a microelectronic device by forming an image on a substrate, said method comprising:

a) providing the photoresist composition prepared by the foregoing method;

b) thereafter, coating a suitable substrate with the photoresist composition from step a);

c) thereafter, heat treating the coated substrate until substantially all of the photoresist solvent is removed; and d) imagewise exposing the photoresist composition and removing the imagewise exposed areas of the photoresist composition with a suitable developer.

DESCRIPTION OF THE PREFERRED EMBODIMENTS

The present invention provides a method for producing a film forming resin suitable for use in a photoresist composition. One step (a) of the method involves: providing a solution of a film forming resin in a solvent, said film forming resin made by polymerizing at least one monomer comprising a cycloolefin or an acid-labile acrylate monomer.

The cycloolefin may be any substituted or unsubstituted multicyclic hydrocarbon containing an unsaturated bond. The cycloolefin monomers include substituted or unsubstituted norbornene, or tetracyclododecne. The substituents on the cycloolefin monomers can be aliphatic or cycloaliphatic alkyls, esters, acids, hydroxyl, nitrile or alkyl derivatives. Examples of cycloolefin monomers, without limitation, are:

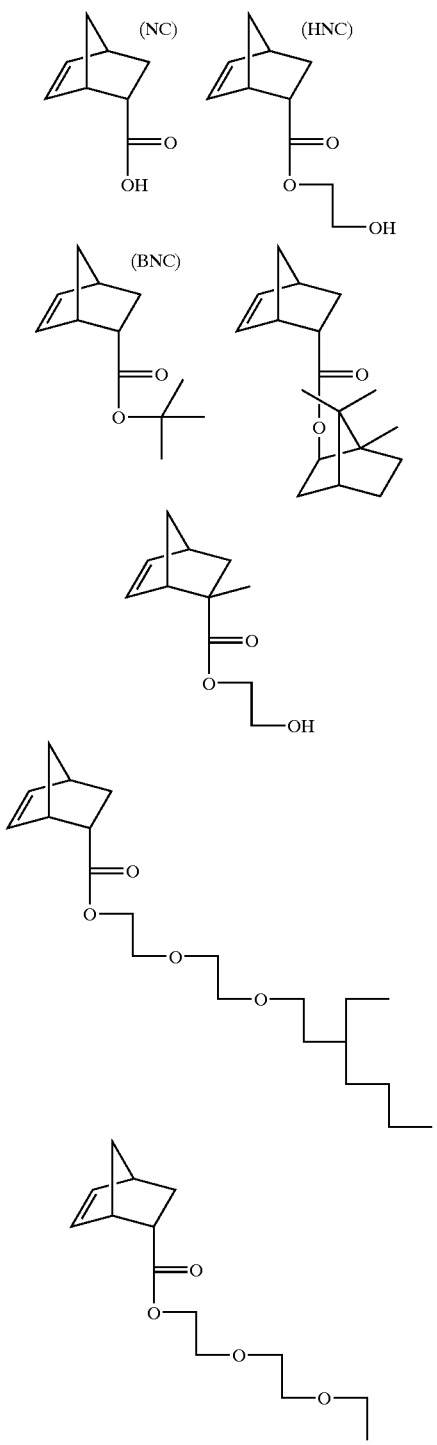

-continued

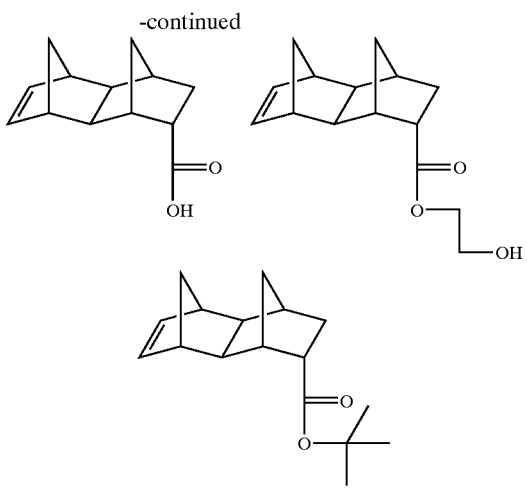

Other cycloolefin monomers which may also be used in synthesizing the polymer include the following:

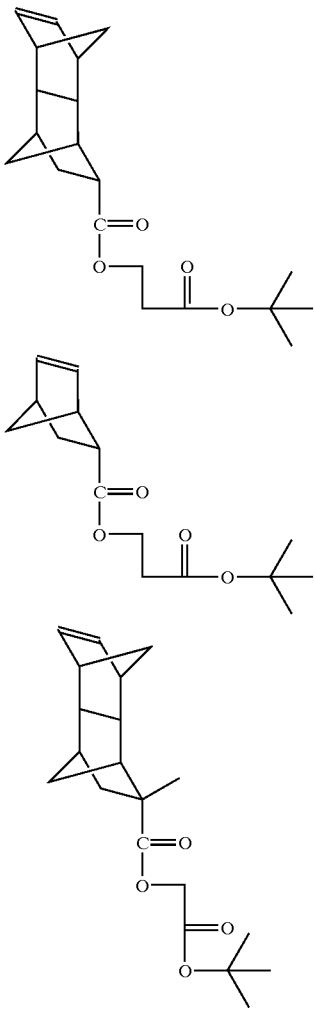

The preferred cycloolefin monomers include t-butyl norbornene carboxylate (BNC), hydroxyethyl norbornene carboxylate (HNC), norbornene carboxylic acid (NC), t-butyl tetracyclo[4.4.0.1.$^{2,6}$1.$^{7,10}$] dodec-8-ene-3-carboxylate, and t-butoxycarbonylmethyl tetracyclo[4.4.0.1.$^{2,6}$1.$^{7,10}$] dodec-8-ene-3-carboxylate. Out of these BNC, HNC, and NC are especially preferred.

The acid labile acrylate or methacrylate monomer can be any acrylate or methacrylate monomer having an acid-labile group. An acid-labile group is one which is easily subjected to acid hydrolysis by an acidic catalyst. In one embodiment, the acid labile acrylate or methacrylate is represented by the formula:

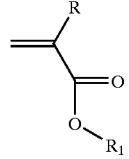

wherein R is hydrogen or a methyl; and $R_1$ is an acid-labile tertiary hydrocarbyl group of about 3 to 20 carbon atoms, an acid-labile trihydrocarbylsilyl group of about 3 to 20 carbon atoms, or an acid-labile cyclic moiety containing from about 5 to about 50 carbon atoms.

As used herein, the term "hydrocarbyl substituent" or "hydrocarbyl group" is used in its ordinary sense, which is well known to those skilled in the art. Specifically, it refers to a group having a carbon atom directly attached to the remainder of the molecule and having predominantly hydrocarbon character. Examples of hydrocarbyl groups include:

(1) hydrocarbon substituents, that is, aliphatic (e.g., alkyl or alkenyl), alicyclic (e.g., cycloalkyl, cycloalkenyl) substituents, and aromatic-, aliphatic-, and alicyclic-substituted aromatic substituents, as well as cyclic substituents wherein the ring is completed through another portion of the molecule (e.g., two substituents together form an alicyclic radical);

(2) substituted hydrocarbon substituents, that is, substituents containing non-hydrocarbon groups which, in the context of this invention, do not alter the predominantly hydrocarbon substituent (e.g., halo (especially chloro and fluoro), hydroxy, alkoxy, mercapto, alkylmercapto, nitro, nitroso, and sulfoxy);

(3) hetero substituents, that is, substituents which, while having a predominantly hydrocarbon character, in the context of this invention, contain other than carbon in a ring or chain otherwise composed of carbon atoms. Heteroatoms include sulfur, oxygen, nitrogen, and encompass substituents as pyridyl, furyl, thienyl and imidazolyl. In general, no more than two, preferably no more than one, non-hydrocarbon substituent will be present for every ten carbon atoms in the hydrocarbyl group; typically, there will be no non-hydrocarbon substituents in the hydrocarbyl group.

Examples of the acid-labile acrylate/methacrylate monomers include: t-butyl acrylate, t-butyl methacrylate, trimethylsilyl acrylate, trimethylsilyl methacrylate, mevaloniclactoane methacrylate (MLMA), 2-methyladamantyl methacrylate (MAdMA), isoadamantyal methacrylate, 3-hydroxy-1-methacryloyloxyadamatane, 3,5-dihydroxy-1-methacryloyloxyadamantane, β-methacryloyloxy-γ-butyrolactone, and α-methacryloyloxy-γ-butyrolactone.

In one embodiment, the monomer comprising the cycloolefin further comprises an acrylate or methacrylate monomer. In one embodiment, the acrylate monomer is one represented by structure:

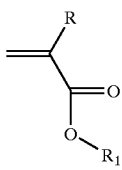

wherein R is hydrogen or methyl; and $R_1$ is a cyclic hydrocarbyl group (including both aromatic and nonaromatic cyclic moieties) containing from about 5 to about 50 carbon atoms, and in one embodiment from about 10 to about 30, and in one embodiment from about 20 to about 40 carbon atoms. Preferred structures for the —$R_1$ group include:

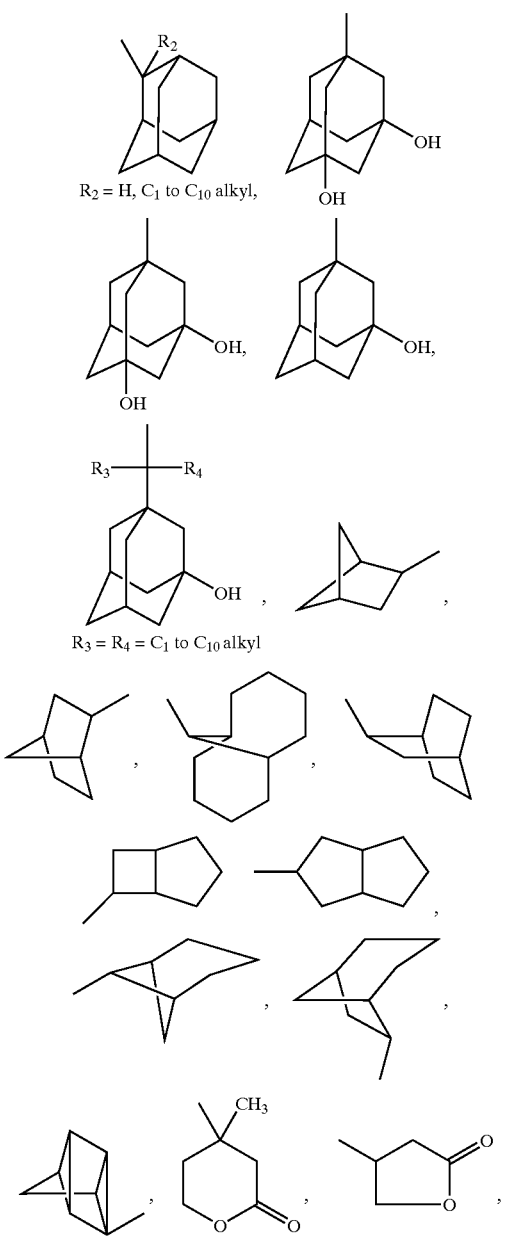

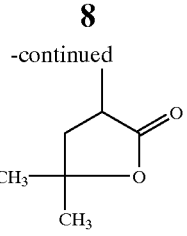

The more preferred acrylate and methacrylate monomers are selected from mevaloniclactone methacrylate (MLMA), 2-methyladamantyl methacrylate (MAdMA), isoadamantyl methacrylate, 3-hydroxy-1-methacryloyloxyadamatane, 3,5-dihydroxy-1-methacryloyloxyadamantane, β-methacryloyloxy-γ-butyrolactone, and α-methacryloyloxy-γ-butyrolactone, with MLMA and MAdMA being most preferred.

In one embodiment, the monomer used to make the film forming resin of the present invention, in addition to containing a cycloolefin, further comprises a cyclic anhydride. The cyclic anhydride can be any anhydride, but is preferably a maleic anhydride, or itaconic anhydride. The most preferred cyclic anhdydride is maleic anhydride.

While not wishing to be bound by theory, it is believed that the cycloolefin and the cyclic anhydride monomers form an alternating polymeric structure, and the amount of the acrylate or methacrylate monomer used to make the film forming resin can be varied to give the optimal lithographic properties. In one embodiment, the percentage of the acrylate monomer relative to the cycloolefin/cyclic anhydride monomers used to make the film forming resin ranges from about 95 mole % to about 5 mole %, preferably from about 75 mole % to about 25 mole %, and most preferably from about 55 mole % to about 45 mole %.

In one embodiment, the film forming resin is a copolymer made by polymerizing the monomers MA, MLMA, MAdMA, BNC, HNC, and NC. In one embodiment, the amounts of acrylate and cycloolfin monomers used to make the copolymer, expressed as mole % of maleic anhydride are: 20–40 mole % BNC, 5–15 mole % HNC, 2–10 mole % NC, 20–30 mole % MLMA, and 20–30 mole % MAdMA. In one embodiment, the relative molar ratio of the monomers varies from 1 mole MA:0.20 mole cycloolefin monomers:0.80 mole acrylate monomers to 1 mole MA:0.80 mole cycloolefin monomers:0.20 mole acrylate monomers. In one embodiment, the relative mole ratio of the monomers is 1 mole MA:0.33 mole cycloolefin monomers:0.67 mole acrylate monomers, and in one embodiment, 1 mole MA:0.67 mole cycloolefin monomers:0.33 mole acrylate monomers. In one embodiment, the mole ratio of NC:HNC:BNC is 1:2:7, and the mole ratio of MadMA to MLMA is 1:1.

In one embodiment, the film forming resin is a copolymer made by polymerizing the monomers MA, MLMA, MAdMA and BNC, and in one embodiment, the mole ratio of the monomers is 1 mole MA:0.33 mole BNC:0.67 mole acrylate monomers.

In one embodiment, the film forming resin is a copolymer made by polymerizing MA, and at least one cycloolefin monomer comprising BNC. In one embodiment, the mole ratio of MA:BNC used to make the copolymer is 1:1. In one embodiment, the cycloolefin monomer comprising BNC further comprises HNC and NC. In one embodiment, the mole ratio of MA to the cycloolefin monomers used to make the copolymer is 1:1, and in one embodiment, the mole ratio of BNC:HNC:NC is 7:2:1.

In one embodiment, the film forming resin comprises a fluoropolymer made by polymerizing at least one fluorine containing cycloolefin or a fluorine containing acid-labile acrylate or methacrylate monomer. Examples of preferred fluorine containing acrylate and methacrylate monomers are trifluoromethacrylic acid, methyl trifluoromethacrylate, and tert-butyltrifluoromethacrylate. Examples of fluorine containing cycloolefin monomers are those represented by the formula:

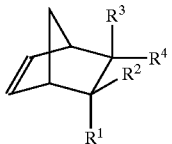

wherein $R^1$ is a member selected from the group consisting of —$CH_2C(CF_3)_2OH$, —$CH_2C(CF_3)_2OR$, —$CH_2C(CF_3)_2Ot$-Boc, -t-Boc, —$OC(O)CH_3$, —COOH, and —COOR wherein R is an alkyl group of 1 to 8 carbon atoms, and in one embodiment 1 to 4 carbon atoms (such as a t-butyl group); $R^2$ is a member selected from the group consisting of —H, —F and —$CF_3$; and $R^3$ and $R^4$ are independently —H or —F; with the proviso that at least one of $R^1$–$R^4$ groups contains a fluorine atom.

The film forming resin of this invention can be synthesized using techniques known in the art. It may be synthesized by free radical polymerization technique using, for example, 2,2'-azobisisobutyronitrile (AIBN) as initiator. A mixture of monomers is added to a reaction vessel together with a solvent, e.g. tetrahydrofuran, and AIBN is added. The reaction is carried out at a suitable temperature for a suitable amount of time to give a polymer with desired properties. The reaction may also be carried out without a solvent. The temperature may range from about 35° C. to about 150° C., preferably 50° C. to 90° C. for about 5 to 25 hours. The reaction may be carried out at atmospheric pressure or at higher pressures. It has been found that a reaction carried out under a pressure of from about 48,000 Pascals to about 250,000 Pascals gives a polymer with more consistent properties, where examples of such desirable properties are molecular weight, dark film loss, yield, etc. Dark film loss is a measure of the solubility of the unexposed photoresist film in the developing solution, and a minimal film loss is preferred. The polymer may be isolated from any suitable solvent, such as, diethyl ether, hexane or mixture of both hexane and ether. Other polymerization techniques may be used to obtain a polymer with the desired chemical and physical properties.

The molecular weight of the film forming resin is not particularly limited. However, the optimum molecular weight will depend on the monomers incorporated into the polymer, the photoactive compound and any other chemical components used, and on the lithographic performance desired. Typically, the weight average molecular weight is in the range of 3,000 to 50,000, the number average molecular weight is in the range from about 1500 to about 10,000, and the polydispersity is in the range 1.1 to 5, preferably 1.5 to 2.5.

The solvent used to prepare the solution of the film forming resin can be any solvent useful in formulating photoreist compositions. Useful solvents include, without limitation, propylene glycol methyl ether acetate (PGMEA), propylene glycol monomethyl ether (PGME), 3-methoxy-3-methyl butanol, 2-heptanone (methyl amyl ketone), ethylene glycol monomethyl ether, ethylene glycol monoethyl ether, diethylene glycol monoethyl ether, ethylene glycol monoethyl ether acetate, ethylene glycol monomethyl acetate, or a monooxymonocarboxylic acid ester, such as methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, ethoxy ethyl propionate, methyl 3-oxypropionate, ethyl 3-oxypropionate, methyl 3-methoxypropionate, ethyl 3-methoxypropionate, methyl 2-oxypropionate, ethyl 2-oxypropionate, ethyl 2-hydroxypropionate (ethyl lactate), ethyl 3-hydroxypropionate, propyl 2-oxypropionate, methyl 2-ethoxypropionate, propyl 2-methoxy propionate, and mixtures thereof.

Another step (b) of the presently claimed method for producing a film forming resin involves providing at least one of two filter sheets. One filter sheet (of step b(i)) comprises a self-supporting fibrous matrix having immobilized therein a particulate filter aid and a particulate ion exchange resin, the ion exchange resin having an average particle size of from about 2 to about 10 microns, wherein said particulate filter aid and ion exchange resin particles are distributed substantially uniformly throughout a cross-section of said matrix. The particulate aid of the filter sheet is preferably acid-washed. The acid used for acid washing is preferably a solution of a mineral acid, such as hydrochloric acid, formic acid, acetic acid, propionic acid, butyric acid, oxalic acid, succinic acid, sulfonic acid, and nitric acid.

This type of filter sheet is preferably one that is described in U.S. Pat. No. 6,103,122, and is available commercially from CUNO Incorporated (Meriden, Conn., U.S.A.), under the name Zeta Plus® 40Q.

Particulate ion exchange resins which can be utilized in the above filter sheet include cation exchange resins, anion exchange resins, and mixtures thereof. Cation exchange resins which may be employed in the preparation of the filter sheet are not particularly limited. Suitable cation exchange resins include sulfonated phenol-formaldehyde condensates, sulfonated phenol-benzaldehyde condensates, sulfonated styrene-divinyl benzene copolymers, sulfonated methacrylic acid-divinyl benzene copolymers, and other types of sulfonic or carboxylic acid group-containing polymers. It should be noted that cation exchange resins are typically supplied with $H^+$ counter ions, $NH_4^+$ counter ions or alkali metal, e.g., $K^+$ and $Na^+$ counter ions. Preferably, the cation exchange resin utilized herein will possess hydrogen counter ions. One preferred particulate cation exchange resin is Microlite PrCH available from Purolite (Bala Cynwyd, Pa.). This is a sulfonated styrene-divinyl benzene copolymer having a $H^+$ counter ion.

Suitable anion exchange resins are known in the art and are disclosed, for example, in Samuelson, *Ion Exchange Separations In Analytical Chemistry*, John Wiley & Sons, New York, 1963, Ch. 2. The preferred anion exchange resins are those resins having a hydroxide counter ion whereby hydroxide is introduced into the photoresist composition during the exchange process. Hence, preferred anion exchange resins are those resins having quaternary ammonium hydroxide exchange groups chemically bound thereto, e.g., styrene-divinyl benzene copolymers substituted with tetramethylammoniumhydroxide. A preferred anion exchange resin is crosslinked polystyrene substituted with quaternary ammonium hydroxide such as the ion exchange resins sold under the trade names AMBERLYST® A-26-OH by Rohm and Haas Company and DOW G51-OH by Dow Chemical Company.

There are various types of particulate filter aids that can be advantageously employed in the filter sheet above, including diatomaceous earth, magnesia, perlite, talc, colloidal silica, polymeric particulates such as those produced by emulsion or suspension polymerization, e.g., polystyrene, polyacrylates, poly(vinyl acetate), polyethylene, (or other such materials as described in Emulsions and Emulsion Technology, Lissant, Kenneth J., Marcel Dekker, 1974), activated carbon, molecular sieves, clay, and the like.

Suitable self-supporting fibrous matrix which may be utilized in the above filter sheet include polyacrylonitrile filbers, nylon filbers, rayon fibers, polyvinyl chloride fibers, cellulose fibers, such as wood pulp and cotton, and cellulose acetate fibers.

In one embodiment, the filter sheet of step (b)(i) further comprises a binder resin. Binder resins suitable for use in the filter sheet include melamine formaldehyde colloids such as those disclosed in U.S. Pat. Nos. 4,007,113 and 4,007,114, polyamido-polyamine epichlorhydrin resins such as those disclosed in U.S. Pat. No. 4,859,340, and polyalkylene oxides such as those disclosed in U.S. Pat. No. 4,596,660. Polyamido-polyamine epichlorohydrin resins are preferred, and can be obtained commercially, such as Polycup™ 1884, 2002 or S2063 (Hercules), Cascamide™ Resin pR-420 (Borden) and Nopcobond™ 35 (Nopco).

In one embodiment, the above filter sheet has an average pore size of about 0.5 to 1.0 μm.

The second filter sheet (of step (b)(ii)) of the present invention is a filter sheet comprising a self-supporting matrix of fibers having immobilized therein particulate filter aid and binder resin, the filter sheet having an average pore size of 0.05 to 0.5 μm, and in one embodiment 0.2 μm.

The self supporting fibrous matrix can comprise fiber selected from the group consisting of polyacrylonitrile fiber, nylon fiber, rayon fiber, polyvinyl chloride fiber, cellulose fiber and cellulose acetate fiber. Preferably, the self-supporting matrix is a matrix of cellulose fibers. The cellulose fibers are preferably derived from a cellulose pulp mixture comprising an unrefined cellulose pulp having a Canadian Standard Freeness of from about +400 to about +800 ml., and a highly refined cellulose pulp having a Canadian Standard Freeness of from +100 to about −600 ml, as disclosed in U.S. Pat. No. 4,606,824.

This filter sheet preferably does not contain any ion exchange resin embedded therein, and is preferably available commercially from CUNO Incorporated (Meriden, Conn., U.S.A.), under the tradename Zeta Plus® 020 EC, and described in U.S. Pat. No. 4,606,824.

Another step (step (c)) of the presently claimed method for producing a film forming resin involves rinsing the filter sheet of step (b), described above, with the solvent of step (a), described above.

Another step (step (d)) of the present method involves passing the solution of the film forming resin through the rinsed filter sheet. The solution of the film forming resin may be passed through either one of the filter sheets, or through both filter sheets, in any order. That is, the film forming resin may be passed only through the filiter sheet of step (b)(i), only through the filter sheet of step (b)(ii), through the filter sheet of step (b)(i) followed by the filter sheet of step (b)(ii), or through the filter sheet of step (b)(ii), followed by the filter sheet of step (b)(i).

In one embodiment, the film forming resin of the present invention suitable for use in a photoresist composition has a concentration of sodium and iron ions that is less than 50 parts per billion (ppb) each, and in one embodiment less than 25 ppb, and in one embodiment, less than 10 ppb.

In the embodiment of the present invention, wherein the monomer used to make the film forming resin, in addition to comprising a cycloolefin, further comprises a cyclic anhydride, the present invention provides the additional advantage that the anhydride groups of the resulting film forming resin are not hydrolyzed when such a resin is purified of metal ion impurities by passing the resin through a filter sheet of the present invention.

Method for Producing a Photoresist Composition

The present invention also provides a method for producing a photoresist composition, said method comprising: providing an admixture of: 1) a film forming resin prepared by the aforementioned method; 2) a photosensitive component in an amount sufficient to photosensitize a photoresist composition; and optionally 3) an additional suitable photoresist solvent to form a photoresist composition.

The photosensitive component is well known to those of ordinary skill in the art. Suitable examples, without limitation, of the photosensitive compound include onium-salts, such as, diazonium salts, iodonium salts, sulfonium salts, halides and esters, although any photosensitive compound that produces an acid upon irradiation may be used. The onium salts are usually used in a form soluble in organic solvents, mostly as iodonium or sulfonium salts, examples of which are diphenyliodoinum trifluoromethane sulfonate, diphenyliodoinum nonafluorobutanesulfonate, triphenylsulfonium trifluromethanesuflonate, triphenylsulfonium nonafluorobutanesufonate and the like. Other compounds that form an acid upon irradiation may be used, such as triazines, oxazoles, oxadiazoles, thiazoles, substituted 2-pyrones. Phenolic sulfonic esters, bis-sulfonylmethane, bis-sulfonylmethanes or bis-sulfonyldiazomethanes, are also useful.

The optional additional photoresist solvent is the same as the solvent used to prepare the solution of the film forming resin above.

Optional Ingredients

Optional ingredients for the photoresist compositions of the present invention include colorants, dyes, anti-striation agents, leveling agents, plasticizers, adhesion promoters, speed enhancers, solvents and such surfactants as non-ionic surfactants, which may be added to the solution of the film forming resin, sensitizer and solvent before the photoresist composition is coated onto a substrate. Examples of dye additives that may be used together with the photoresist compositions of the present invention include Methyl Violet 2B (C.I. No. 42535), Crystal Violet (C.I. 42555). Malachite Green (C.I. No. 42000), Victoria Blue B (C.I. No. 44045) and Neutral Red (C.I. No. 50040) at one to ten percent weight levels, based on the combined weight of the film forming resin and sensitizer. The dye additives help provide increased resolution by inhibiting back scattering of light off the substrate.

Anti-striation agents may be used at up to a five percent weight level, based on the combined weight of the film forming resin and sensitizer. Plasticizers which may be used include, for example, phosphoric acid tri-(beta-chloroethyl)-ester; stearic acid; dicamphor; polypropylene; acetal resins; phenoxy resins; and alkyl resins, at one to ten percent weight levels, based on the combined weight of the film forming resin and sensitizer. The plasticizer additives improve the coating properties of the material and enable the application of a film that is smooth and of uniform thickness to the substrate.

Adhesion promoters which may be used include, for example, beta-(3,4-epoxy-cyclohexyl)-ethyltrimethoxysilane; p-methyl-disilane-methyl methacrylate; vinyl trichlorosilane; and gamma-amino-propyl triethoxysilane, up to a 4 percent weight level, based on the combined weight of the film forming resin and sensitizer. Development speed enhancers that may be used include, for example, picric acid, nicotinic acid or nitrocinnamic acid up to a 20 percent weight level, based on the combined weight of the film forming resin and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to 95% by weight of the solids in the composition. Solvents, of course are substantially removed after coating of the photoresist solution on a substrate and subsequent drying. Non-ionic surfactants that may be used include, for example, nonylphenoxy poly(ethyleneoxy) ethanol; octylphenoxy ethanol at up to 10% weight levels, based on the combined weight of the film forming resin and sensitizer.

Method for Producing a Microelectronic Device

The present invention also provides a method for producing a microelectronic device by forming an image on a substrate, said method comprising:

a) providing the aforementioned photoresist composition;
b) thereafter, coating a suitable substrate with the photoresist composition from step a);
c) thereafter, heat treating the coated substrate until substantially all of the solvent is removed; and
d) image-wise exposing the coated substrate; and then removing the imagewise exposed areas of the coated substrate with a suitable developer.

The photoresist composition can be applied to the substrate by any conventional method used in the photoresist art, including dipping, spraying, whirling and spin coating. When spin coating, for example, the resist solution can be adjusted with respect to the percentage of solids content, in order to provide a coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist composition may also be coated over an antireflective coating.

The photoresist compositions produced by the described procedure are particularly suitable for application to thermally grown silicon/silicon dioxide-coated wafers, such as are utilized in the production of microprocessors and other miniaturized integrated circuit components. An aluminum/aluminum oxide wafer can also be used. The substrate may also comprise various polymeric resins, especially transparent polymers such as polyesters. The substrate may have an adhesion promoted layer of a suitable composition, such as one containing hexa-alkyl disilazane, preferably hexamethyl disilazane (HMDS).

The photoresist composition is coated onto the substrate, and the coated substrate is heat treated until substantially all of the solvent is removed. In one embodiment, heat treatment of the coated substrate involves heating the coated substrate at a temperature from 70° C. to 150° C. for from 30 seconds to 180 seconds on a hot plate or for from 15 to 90 minutes in a convection oven. This temperature treatment is selected in order to reduce the concentration of residual solvents in the photoresist composition, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from 95° C. to 120° C. The treatment is conducted until the rate of change of solvent removal becomes relatively insignificant. The temperature and time selection depends on the photoresist properties desired by the user, as well as the equipment used and commercially desired coating times.

The coated substrate can then be exposed to actinic radiation, e.g., ultraviolet radiation, at a wavelength of from 100 nm to 300 nm, x-ray, electron beam, ion beam or laser radiation, in any desired pattern, produced by use of suitable masks, negatives, stencils, templates, etc.

The substrate coated with the photoresist composition is then optionally subjected to a post exposure second baking or heat treatment, either before or after development. The heating temperatures may range from 90° C. to 150° C., more preferably from 100° C. to 130° C. The heating may be conducted for from 30 seconds to 2 minutes, more preferably from 60 seconds to 90 seconds on a hot plate or 30 to 45 minutes by convection oven.

The exposed photoresist-coated substrates are developed to remove the image-wise exposed areas (positive photoresists), or the unexposed areas (negative photoresists), by immersion in an alkaline developing solution or developed by a spray development process. The solution is preferably agitated, for example, by nitrogen burst agitation. The substrates are allowed to remain in the developer until all, or substantially all, of the photoresist coating has dissolved from the exposed or unexposed areas. Developers can include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

EXAMPLES

Example 1

A copolymer was synthesized from 28.2 g of t-butyl norbornene carboxylate (BNC) (0.35 moles), 4.82 g of hydroxyethyl norbornene carboxylate (HNC) (0.10 moles), 1.82 g of norbornene carboxylic acid (NC) (0.05 moles), 7.85 g of mevaloniclactone methacrylate (MLMA) (1.0 moles) and 9.27 g of 2-methyladamantyl methacrylate (MAdMA) (0.25 moles) and 26 g of maleic anhydride (MA) (0.25 moles) in presence of 2 weight % of AIBN in tetrahydrofuran(THF) at 60% solid. The above recipe corresponds to 35 mole percent BNC, 10 mole percent HNC, 5 mole percent NC, 25 mole percent each of MLMA and MAdMA and 100 mole percent of maleic anhydride. The mole percents are based on moles of maleic anhydride. The polymerization reaction was carried out in a pressure reactor, where the starting pressure is about 48,260 Pascals (7 pounds per square inch (psi)) for 18 hours and the polymer was isolated by two precipitations from diethyl ether twice (1/10 v/v ratio each time). The copolymer was dissolved in PGMEA to make a 14% solution A stainless steel pressure holder was cleaned with both electronic grade acetone and PGMEA. A Zeta Plus® 40Q disc filter sheet was installed and the holder was filled with 200 ml of electronic grade PGMEA. With 1.0 psi (6894 Pascals), the PGMEA was filtered through a 40Q disc. The holder was filled with polymer solution and filled filtered through with 4.0 psi (27,576 Pascals) nitrogen pressure. The solution of the copolymer in PGMEA was filtered through the 40Q disc filter sheet. Metal ion concentrations, for sodium and potassium, measured by atomic absorption spectroscopy, in the copolymer solution before and after filtration are shown below in Table 1. In the tables below, the precision of measurement in the reported concentrations is about ± about 2 ppb.

TABLE 1

| Metal ions | Concentration before (ppb) | Concentration after (ppb) |
| --- | --- | --- |
| Na | 101 | 4 |
| K | 29 | 1 |

Example 2

The solution of the copolymer in PGMEA from Example 1 was successively passed through the 40Q disc filter sheet, followed by a Zeta Plus® 020 EC disc filter sheet. Metal ion concentrations before and after each filtration are shown below in Table 2.

TABLE 2

| Metal ions | Conc. before filt. (ppb) | Conc. after 40Q (ppb) | Conc. after 020 EC (ppb) |
| --- | --- | --- | --- |
| Na | 129 | 6 | 12 |
| K | 34 | 2 | 2 |
| Fe | 40 | 29 | 6 |
| Cr | 10 | 1 | 2 |
| Cu | 9 | 3 | 4 |
| Ni | 28 | 14 | 13 |
| Ca | 35 | 5 | 4 |
| Al | 5 | 1 | <1 |
| Mg | 15 | 5 | 2 |
| Mn | 12 | 1 | 3 |
| Zn | 4 | 1 | <1 |
| Pb | 14 | 3 | 2 |

Example 3

A different batch of the solution of the copolymer in PGMEA, prepared as in Example 1 was successively passed through a 020 EC disc filter, followed by a 40Q disc filter sheet. Metal ion concentrations before and after each filtration are shown below in Table 3.

TABLE 3

| Metal ions | Conc. before filtration (ppb) | Conc. after 020 EC (ppb) | Conc. after 40Q (ppb) |
| --- | --- | --- | --- |
| Na | 80 | 74 | 16 |
| K | 5 | 9 | 5 |
| Fe | 19 | 10 | 11 |
| Cr | 1 | <1 | 1 |
| Cu | 2 | <1 | 2 |
| Ni | 3 | 2 | 2 |
| Ca | 12 | 8 | 6 |
| Al | 3 | 2 | 2 |
| Mg | 1 | 3 | 5 |
| Mn | <1 | <1 | <1 |
| Zn | 28 | 14 | 8 |

Example 4

A different batch of the solution of the copolymer in PGMEA prepared as in Example 1 was successively passed through a 020 EC disc filter, followed by a 40Q disc filter sheet. Metal ion concentrations before and after each filtration are shown below in Table 4.

TABLE 4

| Metal ions | Conc. before filtration (ppb) | Conc. after 020 EC (ppb) | Conc. after 40Q (ppb) |
| --- | --- | --- | --- |
| Na | 62 | 5 | 2 |
| K | 14 | 1 | <1 |
| Fe | 152 | 41 | 61 |
| Cr | 10 | 7 | 6 |
| Cu | 3 | 2 | <1 |
| Ni | 14 | 9 | 9 |
| Ca | 8 | 2 | 2 |
| Al | 3 | 2 | <1 |
| Mg | 1 | 3 | 1 |
| Mn | 3 | 2 | 1 |
| Zn | 12 | 5 | 4 |

Example 5

A different batch of the solution of the copolymer in PGMEA, prepared as in Example 1 was successively passed through a 40Q disc filter, followed by a 020EC disc filter sheet. Metal ion concentrations before and after each filtration are shown below in Table 5.

TABLE 5

| Metal ions | Conc. before filtration (ppb) | Conc. after 40Q (ppb) | Conc. after 020 EC (ppb) |
| --- | --- | --- | --- |
| Na | 70 | 4 | 5 |
| K | 2 | <1 | <1 |
| Fe | 5 | 4 | 3 |
| Cr | <1 | <1 | <1 |
| Cu | 2 | 2 | 2 |
| Ni | 3 | 3 | 2 |
| Ca | 3 | 2 | 2 |
| Al | 1 | 2 | 1 |
| Mg | 3 | 2 | 3 |
| Mn | <1 | 4 | 2 |
| Zn | 14 | 12 | 9 |
| Pb | 4 | 3 | 2 |

Example 6

A solution of a methacrylate copolymer of MAdMA and MLMA (1:1 mole ratio) ($M_w$=17643; $M_n$=10,246; $T_g$=170°

C.) in ethyl lactate (11.5 wt % polymer solution) was passed through a 40Q disc filter sheet at the rate of 25 ml/min. Metal ion concentrations before and after each filtration are shown below in Table 6.

TABLE 6

| Metal ions | Conc. before filtration (ppb) | Conc. after 40Q (ppb) |
|---|---|---|
| Na | 21 | 2 |
| K | 8 | <1 |
| Fe | 4 | 4 |
| Cr | <1 | <1 |
| Cu | 4 | 2 |
| Ni | 2 | <1 |
| Ca | 8 | <1 |
| Al | 2 | <1 |
| Mg | <1 | 1 |
| Mn | <1 | <1 |
| Zn | 3 | 3 |
| Pb | <1 | <1 |

Example 7

Example 6 was repeated and the results are shown in Table 7.

TABLE 7

| Metal ions | Conc. before filtration (ppb) | Conc. after 40Q (pp.) |
|---|---|---|
| NA | 21 | 1 |
| K | 8 | <1 |
| Fe | 4 | 3 |
| Kr | <1 | <1 |
| Cu | 4 | 3 |
| In | 2 | <1 |
| Ca | 8 | <1 |
| Al | 2 | <1 |
| Mg | <1 | <1 |
| MN | <1 | <1 |
| Zn | 3 | 3 |
| Pb | <1 | <1 |

Example 8

A solution of a methacrylate copolymer of MAdMA and MLMA (1:1 mole ratio) ($M_w$=14069; $M_n$=7976; $T_g$=176° C.) in ethyl lactate (11.5 wt % polymer solution) was passed through a 40Q disc filter sheet at the rate of 25 ml/min. Metal ion concentrations before and after each filtration are shown below in Table 8.

TABLE 8

| Metal ions | Conc. before filtration (ppb) | Conc. after 40Q (ppb) |
|---|---|---|
| Na | 13 | 1 |
| K | 1 | <1 |
| Fe | 13 | <1 |
| Cr | 3 | <1 |
| Cu | <1 | <1 |
| Ni | 3 | <1 |
| Ca | 3 | <1 |
| Al | 5 | <1 |
| Mg | 3 | <1 |
| Mn | <1 | <1 |
| Zn | 6 | 4 |
| Pb | 4 | <1 |

Example 8

The procedure of Examples 1–7 is used except that the copolymer used is made by polymerizing a 1:1 mole ratio of MA:BNC. The metal ion concentrations after filtration through the filter sheet(s) are low and similar to those of the above examples.

Example 9

The procedure of Examples 1–7 is used except that the copolymer used is made by polymerizing a 0.50:0.35:0.10:0.05 mole ratio of MA:BNC:HNC:NC respectively. The metal ion concentrations after filtration through the filter sheet(s) are low and similar to those of the above examples.

Each of the documents referred to above is incorporated herein by reference in its entirety, for all purposes.

Except in the Examples, or where otherwise explicitly indicated, all numerical quantities in this description specifying amounts of materials, reaction conditions (such as temperature), molecular weights, number of carbon atoms, and the like, are to be understood as modified by the word "about."

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A method for producing a film forming resin suitable for use in a photoresist composition, said method comprising the steps of:
   (a) providing a solution of a film forming resin in a solvent, said film forming resin made by polymerizing at least one monomer comprising a cycloolefin or an acid labile acrylate or a methacrylate monomer;
   (b) providing the following two filter sheets:
      (i) a filter sheet comprising a self-supporting fibrous matrix having immobilized therein a particulate filter aid and a particulate ion exchange resin, said ion exchange resin having an average particle size of from about 2 to about 10 micrometers ($\mu$m), wherein said particulate filter aid and ion exchange resin particles are distributed substantially uniformly throughout a cross-section of said matrix; and
      (ii) a filter sheet comprising a self-supporting matrix of fibers having immobilized therein a particulate filter aid and a binder resin, said filter sheet having an average pore size of 0.05 to 0.5 $\mu$m;
   (c) rinsing the filter sheets of step (b) with the solvent of step (a); and
   (d) passing the solution of the film forming resin through either the filter sheet of step (b)(i) as rinsed in step (c) and then through the rinsed filter sheet of step (b)(ii) as rinsed in step (c) or the filter sheet of step (b)(ii) as rinsed in step (c) and then through the filter sheet of step (b)(i) as rinsed in step (c),
   thereby producing the film forming resin suitable for use in a photoresist composition.

2. The method of claim 1, wherein the particulate filter aid of the filter sheet (b)(i) is acid washed.

3. The method of claim 2, wherein the acid is at least one member selected from the group consisting of hydrochloric acid, formic acid, acetic acid, propionic acid, butyric acid, oxalic acid, succinic acid, sulfonic acid, and nitric acid.

4. The method of claim 1, wherein the self-supporting matrix of fibers of the filter sheet (b)(ii) are selected from the group consisting of polyacrylonitrile fiber, nylon fiber, rayon fiber, polyvinyl chloride fiber, cellulose fiber and cellulose acetate fiber.

5. The method of claim 4, wherein the self-supporting matrix of fibers are cellulose fibers.

6. The method of claim 1, wherein the filter sheet (b)(ii) does not contain any ion exchange resin.

7. The method of claim 1, wherein the acid labile acrylate or methacrylate monomer is represented by the formula:

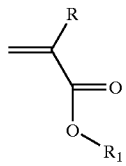

wherein R is hydrogen or methyl; and $R_1$ is an acid labile tertiary hydrocarbyl group of about 3 to 20 carbon atoms, an acid-labile trihydrocarbylsilyl group of about 3 to 20 carbon atoms, or an acid-labile cyclic moiety containing from about 5 to about 50 carbon atoms.

8. The method of claim 1, wherein the acid labile acrylate or methacrylate monomer is selected from the group consisting of t-butyl acrylate, t-butyl methacrylate, trimethylsilyl acrylate, trimethylsilyl methacrylate, mevaloniclactone methacrylate (MLMA), 2-methyladamantyl methacrylate (MAdMA), isoadamantyl methacrylate, 3-hydroxy-1-methacryloyloxyadamatane, 3,5-dihydroxy-1-methacryloyloxyadamantane, β-methacryloyloxy-γ-butyrolactone, and α-methacryloyloxy-γ-butyrolactone.

9. The method of claim 1, wherein the cycloolefin is at least one member selected from the group consisting of norbornenes and tetracyclododecenes.

10. The method of claim 1, wherein the cycloolefin is at least one member selected from the group consisting of t-butyl norbornene carboxylate (BNC), hydroxyethyl norbornene carboxylate (HNC), norbornene carboxylic acid (NC), t-butyl tetracyclo[4.4.0.1.$^{2,6}$1.$^{7,10}$]dodec-8-ene-3-carboxylate, and t-butoxycarbonylmethyl tetracyclo[4.4.0.1.$^{2,6}$1.$^{7,10}$]dodec-8-ene-3-carboxylate.

11. The method of claim 1, wherein the monomer comprising the cycloolefin further comprises an acrylate or a methacrylate.

12. The method of claim 11, wherein the acrylate or methacrylate is represented by the formula:

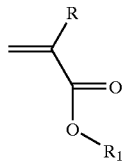

wherein R is hydrogen or a methyl; and $R_1$ is a cyclic hydrocarbyl group containing from about 5 to about 50 carbon atoms.

13. The method of claim 12, wherein the cyclic hydrocarbyl group is a nonaromatic cyclic hydrocarbyl group.

14. The method of claim 11, wherein the acrylate or methacrylate is at least one member selected from the group consisting of mevaloniclactone methacrylate (MLMA), 2-methyladamantyl methacrylate (MAdMA), isoadamantyl methacrylate, 3-hydroxy-1-methacryloyloxyadamantane, 3,5-dihydroxy-1-methacryloyloxyadamantane, β-methacryloyloxy-γ-butyrolactone, and α-methacryloyloxy-γ-butyrolactone.

15. The method of claim 1, wherein the monomer comprising the cycloolefin further comprises a cyclic anhydride.

16. The method of claim 15, wherein the cyclic anhydride is a maleic anhydride.

17. The method of claim 15, wherein the cyclic anhydride is itaconic anhydride.

18. The method of claim 1, wherein the film forming resin is a copolymer made by polymerizing maleic anhydride (MA), the acrylate monomers mevaloniclactone methacrylate (MLMA), 2-methyladamantyl methacrylate (MAdMA), and the following cycloolefin monomers: t-butyl norbornene carboxylate (BNC), hydroxyethyl norbornene carboxylate (HNC), and norbornene carboxylic acid (NC).

19. The method of claim 18, wherein the amounts of acrylate and cycloolefin monomers used to make the copolymer, expressed as mole % of maleic anhydride are: 35 mole % BNC, 10 mole % HNC, 5 mole % NC, 25% MLMA and 25% MAdMA.

20. The method of claim 18, wherein the relative molar ratio of the monomers varies from about 1 mole MA: 0.20 mole cycloolefin monomers: 0.80 mole acrylate monomers to about 1 mole MA: 0.80 mole cycloolefin monomers: 0.20 mole acrylate monomers.

21. The method of claim 1, wherein the film forming resin is a copolymer made by polymerizing maleic anhydride (MA), the acrylate monomers mevaloniclactone methacrylate (MLMA), 2-methyladamantyl methacrylate (MAdMA), and the cycloolefin monomer t-butyl norbornene carboxylate (BNC).

22. The method of claim 1, wherein the film forming resin is a copolymer made by polymerizing maleic anhydride (MA) and at least one cycloolefin monomer comprising norbornene carboxylate (BNC).

23. The method of claim 22, wherein the cycloolefin monomer further comprises hydroxyethyl norbornene carboxylate (HNC), and norbornene carboxylic acid (NC).

24. The method of claim 1, wherein the film forming resin comprises a fluoropolymer made by polymerizing at least one fluorine containing cycloolefin or a fluorine containing acid labile acrylate or a methacrylate monomer.

25. The method of claim 24, wherein the fluorine containing acid labile acrylate or methacrylate monomer is selected from the group consisting of methyl trifluroacrylate, methyl trifluoromethacrylate, tert-butyltrifluoromethacrylate, tert-butyltrifluoroacrylate and the fluorine containing cycloolefin is represented by the formula:

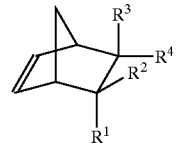

wherein $R^1$ is a member selected from the group consisting of $—CH_2C(CF_3)_2OH$, $—CH_2C(CF_3)_2OR$, $—CH_2C(CF_3)_2Ot\text{-Boc}$, $\text{-t-Boc}$, $—OC(O)CH_3$, $—COOH$, and $—COOR$ wherein R is an alkyl group of 1 to about 4 carbon atoms; $R^2$ is a member selected from the group consisting of $—H$, $—F$ and $—CF_3$; and $R^3$ and $R^4$ are independently $—H$ or $—F$; with the proviso that at least one of $R^1\text{–}R^4$ groups contains a fluorine atom.

26. The method of claim 25, wherein R is a t-butyl group.

27. The method of claim 1, wherein the filter sheet (i) has an average pore size of about 0.5 to 1.0 μm.

28. The method of claim 1, wherein in the filter sheet (i), the ion exchange resin comprises a cation exchange resin.

29. The method of claim 28, wherein the cation exchange resin is selected from the group consisting of sulfonated phenol-formaldehyde condensates, sulfonated phenol-benzaldehyde condensates, sulfonated styrene-divinyl benzene copolymers and sulfonated methacrylic acid-divinyl benzene copolymers.

30. The method of claim 1, wherein in filter sheet (i), the ion exchange resin comprises a mixture of a cation exchange resin and an anion exchange resin.

31. The method of claim 1, wherein in filter sheet (i), the particulate filter aid is at least one member selected from the group consisting of diatomaceous earth, magnesia, perlite, talc, colloidal silica, polymeric particulates, activated carbon, molecular sieves, and clay.

32. The method of claim 1, wherein in the filter sheet (i), the self-supporting fibrous matrix comprises fiber selected from the group consisting of polyacrylonitrile fiber, nylon fiber, rayon fiber, polyvinyl chloride fiber, cellulose fiber and cellulose acetate fiber.

33. The method of claim 1, wherein filter sheet (ii) has an average pore size of about 0.2 $\mu$m.

34. The method of claim 1, wherein after step (d), the film forming resin suitable for use in a photoresist composition has a concentration of sodium and iron ions that is less than 50 ppb each.

35. The method of claim 1, wherein after step (d), the film forming resin suitable for use in a photoresist composition has a concentration of sodium and iron ions that is less than 25 ppb each.

36. The method of claim 1, wherein after step (d), the film forming resin suitable for use in a photoresist composition has a concentration of sodium and iron ions that is less than 10 ppb each.

37. A method for producing a photoresist composition, said method comprising: providing an admixture of: 1) a film forming resin prepared by the method of claim 1; 2) a photosensitive component in an amount sufficient to photosensitize a photoresist composition; and 3) a suitable photoresist solvent.

38. A method for producing a microelectronic device by forming an image on a substrate, said method comprising:
 a) providing the photoresist composition prepared by the method of claim 37;
 b) thereafter, coating a suitable substrate with the photoresist composition from step a);
 c) thereafter, heat treating the coated substrate until substantially all of the photoresist solvent is removed; and
 d) imagewise exposing the photoresist composition and removing the imagewise exposed areas of the photoresist composition with a suitable developer.

39. The method of claim 1, wherein step (d) is passing the solution of the film forming resin through the filter sheet of step (b)(i) as rinsed in step (c) and then through the filter sheet of step (b)(ii) as rinsed in step (c).

40. A method for producing a photoresist composition, said method comprising: providing an admixture of: 1) a forming resin prepared the method of claim 39; 2) a photosensitive component in an amount sufficient to photosensitize a photoresist composition; and 3) a suitable photoresist solvent.

41. A method for producing a microelectronic device by forming an image on a substrate, said method comprising:
 a) providing the photoresist composition prepared by the method of claim 40;
 b) thereafter, coating a suitable substrate with the photoresist composition from step a);
 c) thereafter, heat treating the coated substrate until substantially all of the photoresist solvent is removed; and
 d) imagewise exposing the photoresist composition and removing the imagewise exposed areas of the photoresist composition with a suitable developer.

42. The method of claim 1, wherein step (d) is passing the solution of the film forming resin through the filter sheet of step (b)(ii) as rinsed in step (c) and then through the filter sheet of step (b)(i) as rinsed in step (c).

43. A method for producing a photoresist composition, said method comprising: providing an admixture of: 1) a film forming resin prepared by the method of claim 42; 2) a photosensitive component in an amount sufficient to photosensitize a photoresist composition; and 3) a suitable photoresist solvent.

44. A method for producing a microelectronic device by forming an image on a substrate, said method comprising:
 a) providing the photoresist composition prepared by the method of claim 43;
 b) thereafter, coating a suitable substrate with the photoresist composition from step a);
 c) thereafter, heat treating the coated substrate until substantially all of the photoresist solvent is removed; and
 d) imagewise exposing the photoresist composition and removing the imagewise exposed areas of the photoresist composition with a suitable developer.

45. A method for producing a film forming resin suitable for use in a photoresist composition, said method comprising the steps of:
 (a) providing a solution of a film forming resin in a solvent, said film forming resin made by polymerizing at least one monomer comprising a cycloolefin or an acid labile acrylate or methacrylate monomer;
 (b) providing the following two filter sheets;
  (i) a filter sheet comprising a self-supporting fibrous matrix having immobilized therein an acid-washed particulate filter aid and a particulate ion exchange resin, said ion exchange resin having an average particle size of from about 2 to about 10 $\mu$m, wherein said particulate filter aid and ion exchange resin particles are distributed substantially uniformly throughout a cross-section of said matrix; and
  (ii) a filter sheet comprising a self-supporting matrix of cellulose fibers having immobilized therein a particulate filter aid and a binder resin, said filter sheet not containing any ion exchange resin embedded therein, and having an average pore size of about 0.05–0.5 $\mu$m;
 (c) rinsing the filter sheets of step (b) with the solvent of step (a); and
 (d) passing the solution of the film forming resin through either the filter sheet of step (b)(i) as rinsed in step (c) and then through the filter sheet of step (b)(ii) as rinsed in step (c) or the filter sheet of step (b)(ii) as rinsed in step (c) and then through the filter sheet of step (b)(i) as rinsed in step (c),
 thereby producing the film forming resin suitable for use in a photoresist composition.

46. A method for producing a photoresist composition, said method comprising: providing an admixture of: 1) a film forming resin prepared by the method of claim 45; 2) a photosensitive component in an amount sufficient to photosensitize a photoresist composition; and 3) a suitable photoresist solvent.

47. A method for producing a microelectronic device by forming an image on a substrate, said method comprising:

a) providing the photoresist composition prepared by the method of claim 46;

b) thereafter, coating a suitable substrate with the photoresist composition from step a);

c) thereafter, heat treating the coated substrate until substantially all of the photoresist solvent is removed; and d) imagewise exposing the photoresist composition and removing the imagewise exposed areas of the photoresist composition with a suitable developer.

48. The method of claim 45, wherein step (d) is passing the solution of the film forming resin through the filter sheet of step (b)(i) as rinsed in step (c) and then through the filter sheet of step (b)(ii) as rinsed in step (c).

49. A method for producing a photoresist composition, said method comprising: providing an admixture of: 1) a film forming resin prepared by the method of claim 48, 2) a photosensitive component in an amount sufficient to photosensitize a photoresist composition; and 3) a suitable photoresist solvent.

50. A method for producing a microelectronic device by forming an image on a substrate, said method comprising:

a) providing the photoresist composition prepared by the method of claim 49;

b) thereafter, coating a suitable substrate with the photoresist composition from step a);

c) thereafter, heat treating the coated substrate until substantially all of the photoresist solvent is removed; and d) imagewise exposing the photoresist composition and removing the imagewise exposed areas of the photoresist composition with a suitable developer.

51. The method of claim 45, wherein step (d) is passing the solution of the film forming resin through the filter sheet of step (b)(ii) as rinsed in step (c) and then through the filter sheet of step (b)(i) as rinsed in step (c).

52. A method for producing a photoresist composition, said method comprising: providing an admixture of: 1) a film forming resin prepared by the method of claim 51; 2) a photosensitive component in an amount sufficient to photosensitize a photoresist composition; and 3) a suitable photoresist solvent.

53. A method for producing a microelectronic device by forming an image on a substrate, said method comprising:

a) providing the photoresist composition prepared by the method of claim 52;

b) thereafter, coating a suitable substrate with the photoresist composition from step a);

c) thereafter, heat treating the coated substrate until substantially all of the photoresist solvent is removed; and d) imagewise exposing the photoresist composition and removing the imagewise exposed areas of the photoresist composition with a suitable developer.

* * * * *